United States Patent
Burt et al.

(10) Patent No.: US 7,205,833 B2
(45) Date of Patent: Apr. 17, 2007

(54) METHOD AND CIRCUIT FOR REDUCED SETTING TIME IN AN AMPLIFIER

(75) Inventors: Rodney T. Burt, Tucson, AZ (US); Joy Y. Zhang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 15 days.

(21) Appl. No.: 10/737,419

(22) Filed: Dec. 15, 2003

(65) Prior Publication Data

US 2005/0127990 A1 Jun. 16, 2005

(51) Int. Cl.
*H03F 1/02* (2006.01)
(52) U.S. Cl. .............................. 330/9; 330/69
(58) Field of Classification Search .............. None
See application file for complete search history.

(56) References Cited

U.S. PATENT DOCUMENTS 5,045,805 A * 9/1991 Schanen .................. 330/107
6,897,731 B2 * 5/2005 Zhang et al. ............. 330/298

OTHER PUBLICATIONS

Franco, Sergio, "Design with Operational Amplifiers and Analog Integrated Circuits," pp. 389-391.

* cited by examiner

*Primary Examiner*—Khanh Van Nguyen
(74) *Attorney, Agent, or Firm*—W. James Brady III; Frederick J. Telecky Jr.

(57) ABSTRACT

An improved method and circuit for reduced settling time in an amplifier are provided. The amplifier comprises a composite amplifier circuit including a first amplifier configured with a second amplifier comprising an integrator circuit. The reduced settling time is facilitated through implementation of a faster path configured between an inverting input terminal of the second amplifier and an output terminal of the first amplifier for current needed by an integrator resistor due to any signal appearing at said inverting input terminal for said high-speed amplifier. The faster path can be realized through the addition of a compensation capacitor between the output terminal of the composite amplifier circuit and the inverting input terminal of the second amplifier. The compensation capacitor can comprise various values depending on any given number of design criteria. The additional path can also minimize the settling time effects from process variations in the various resistors and capacitors, as well as the amplifier gains, realized in the composite amplifier circuit.

18 Claims, 3 Drawing Sheets

METHOD AND CIRCUIT FOR REDUCED SETTING TIME IN AN AMPLIFIER

TECHNICAL FIELD

The present invention relates, generally, to amplifiers. More particularly, the present invention relates to a method and circuit for reduced settling time in an amplifier.

BACKGROUND OF THE INVENTION

In the efforts for optimizing and improving operation in various high-speed microcontroller-based devices, such as various instrumentation and measurement equipment and the like, significant attention has been given to the further improvement of the high-speed amplifiers utilized. One category of high-speed amplifiers commonly utilized is transimpedance amplifiers. In some high-performance instances, such transimpedance amplifiers are configured with a composite amplifier arrangement, for example with a high-speed amplifier combined with a lower speed auto-zero amplifier.

For example, with reference to FIG. 1, a prior art composite amplifier circuit 100 is illustrated that comprises a high-speed amplifier 102 and a lower-speed, e.g., an auto-zero, amplifier 104. High-speed amplifier 102 is configured for providing an output voltage at output terminal $V_{OUT}$. The inverting input terminal of amplifier 102 is configured to provide a negative input terminal INN for composite amplifier circuit 100. Auto-zero amplifier 104 together with a resistor $R_0$ and a capacitor $C_0$ comprise an integrator circuit. With low frequency signals provided through the integrator circuit comprising auto-zero amplifier 104, resistor $R_0$ and capacitor $C_0$, low DC offset and low 1/f noise is generally realized. A non-inverting input terminal of auto-zero amplifier 104 is configured to provide a positive input terminal INP for composite amplifier circuit 100. An output terminal of auto-zero amplifier 104 is coupled to a non-inverting input terminal of amplifier 102 through a first order low-pass filter comprising resistor $R_1$ and capacitor $C_1$ configured at the output terminal of auto-zero amplifier 104. The low-pass filter is configured to reduce noise from auto-zero amplifier 104, including auto-zero switching noise.

In many applications, it is highly desirable for composite amplifier circuit 100 to provide a fast settling time, which is defined as the amount of time for composite amplifier circuit 100 to finally settle to an ideal final amplified signal at output terminal $V_{OUT}$ corresponding to a given input signal provided to input terminals INN and INP. For faster settling times in composite amplifier circuit 100, the frequency response is configured to provide a single-pole response. However, the overall frequency response tends to fluctuate due to pole-zero doublets, thus resulting in a dramatic slowing down of the settling time to a high precision of composite amplifier circuit 100.

For example, with reference to FIG. 2A, a diagram illustrates an output signal at output terminal $V_{OUT}$ based on a step input signal configured to provide an ideal final value 4.00000 volt signal. As realized by a "zoomed-in" view illustrated in FIG. 2B, upon receiving the step input signal, the output signal of composite amplifier circuit 100 immediately settles to within 0.1% accuracy; however circuit 100 requires approximately another 1 mS before the output signal reaches within 0.001% accuracy.

A main reason for the slower settling time is due to the existence of a slow path for certain signals to pass through to output terminal $V_{OUT}$, as well as difficulties in zero-pole cancellation. For example, for a large step at output terminal $V_{OUT}$, a small voltage is required at input terminal INN. This small voltage causes a current through resistor $R_0$ of the integrator circuit. This same current also passes through capacitor $C_0$ that provides a slow path. This slower settling time can be further exacerbated by process variations on the various resistors and capacitors, as well as the amplifier gains, realized in composite amplifier circuit 100. Thus, while composite amplifier circuit 100 can provide a good DC response, due to difficulties in pole-zero cancellation and the slower path, any step responses for composite amplifier circuit 100 will not completely settle until the integrator loop has settled to a final value.

SUMMARY OF THE INVENTION

In accordance with various aspects of the present invention, a method and circuit for reduced settling time in an amplifier are provided. In accordance with an exemplary embodiment, the amplifier comprises a composite amplifier circuit including a first amplifier configured with a second amplifier comprising an integrator circuit. The reduced settling time is facilitated through implementation of a faster compensation path configured between an inverting input terminal of the second amplifier and an output terminal of the first amplifier to provide any current required through an integrator resistor due to any small signal that can appear at an inverting input terminal of the composite amplifier. As a result, current does not flow through the slower integrator path, thus reducing the settling time.

In accordance with an exemplary embodiment, the faster compensation path is realized through the addition of a compensation capacitor between the output terminal of the first amplifier and the inverting input terminal of the second amplifier. The compensation capacitor can comprise various values depending on any given number of design criteria, including gain bandwidth product. In addition to reduced settling time, the additional path can also minimize the settling time effects from process variations in the various resistors and capacitors, as well as the amplifier gains, realized in the composite amplifier circuit.

In accordance with an exemplary embodiment, a method for providing a reduced settling time in an amplifier circuit comprises a first step of generating an output signal from an output terminal of a first amplifier configured with a second amplifier comprising an integrator circuit, and a second step of providing a compensation path between the output terminal of the first amplifier and the inverting input terminal of the second amplifier to provide any current required through an integrator resistor due to any small signal that can appear at an inverting input terminal of the amplifier circuit.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE PRESENT INVENTION

The present invention may be described herein in terms of various functional components. It should be appreciated that such functional components may be realized by any number of hardware or structural devices configured to perform the specified functions. For example, the present invention may employ various integrated components, e.g., buffers, supply references, current sources, signal conditioning devices and the like, comprised of various electrical devices, e.g., resistors, transistors, capacitors, diodes and other components whose values may be suitably configured for various intended purposes. In addition, the present invention may be practiced in any integrated circuit application where a compensation path can be utilized. However for purposes of illustration only, exemplary embodiments of the present invention are described herein in connection with a composite amplifier circuit. Further, it should be noted that while various components may be suitably coupled or connected to other components within exemplary circuits, such connections and couplings can be realized by direct connection between components, or by connection or coupling through other components and devices located thereinbetween.

Figure 1:
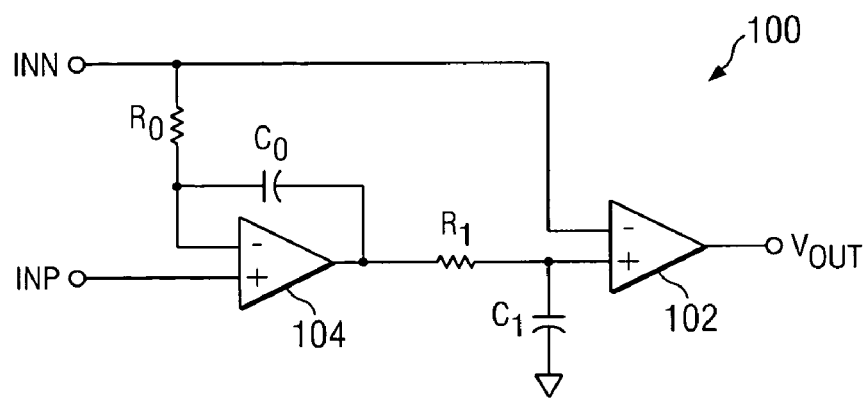
FIG. 1 illustrates a block diagram of a prior art composite amplifier circuit.
Figure 2A:
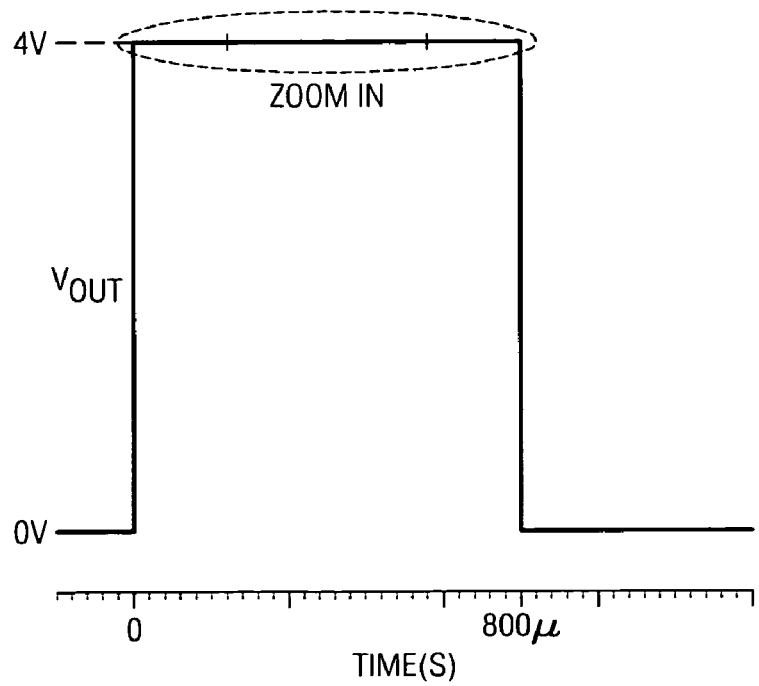
FIGS. 2A and 2B illustrate step-response curves representing the settling time of an output voltage signal from a prior art amplifier circuit due to a step response signal.
Figure 2B:
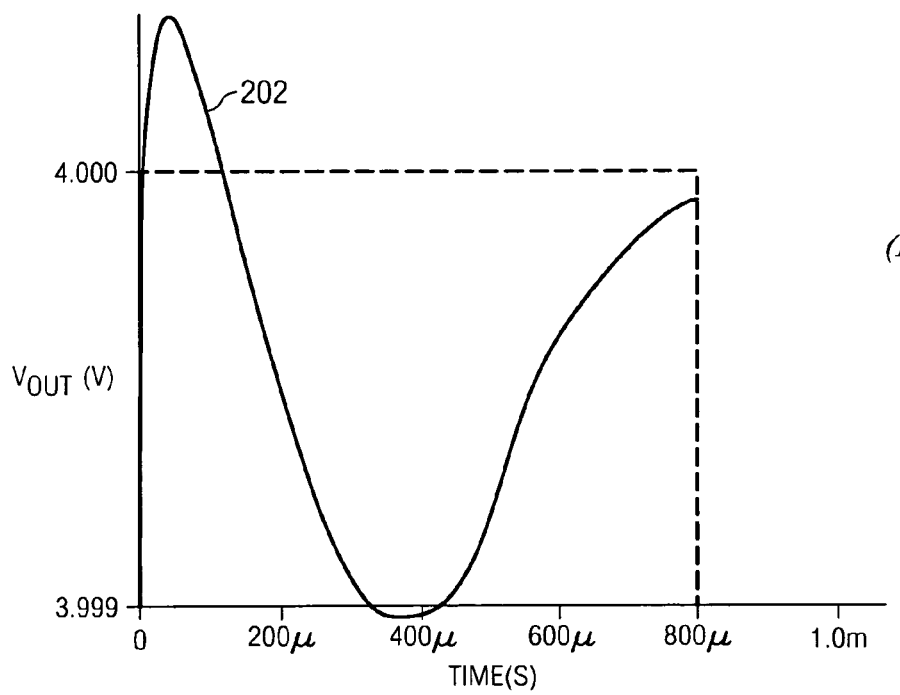
Figure 3:
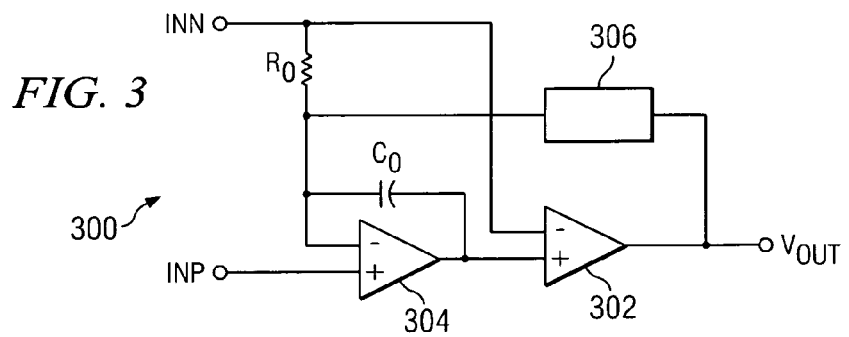
FIG. 3 illustrates a block diagram of an exemplary composite amplifier circuit having an additional compensation path in accordance with an exemplary embodiment of the present invention.

In accordance with various aspects of the present invention, a method and circuit for reduced settling time in an amplifier are provided. In accordance with an exemplary embodiment, with reference to FIG. 3, an exemplary amplifier comprises a composite amplifier circuit 300 including a first amplifier 302 configured with a second amplifier 304. First amplifier 302 can comprise various amplifier configurations for providing an output voltage at output terminal $V_{OUT}$, and can operate at various bandwidths, e.g., at approximately 100 MHz, or more or less frequencies such as 1 MHz to 1 GHz. In an exemplary embodiment, first amplifier comprises a high-speed amplifier, e.g., an amplifier operating at approximately 100 MHz; however, amplifier 302 can comprise any amplifier needing correction of DC characteristics. Second amplifier 304 is configured with a resistor $R_0$ and a capacitor $C_0$ as an integrator circuit coupled between input terminals INN and INP and first amplifier 302, e.g., a non-inverting input terminal of second amplifier 304 is coupled to input terminal INP, an inverting input terminal of second amplifier 304 is coupled to input terminal INN, e.g., coupled through circuit components $R_0$, and an output terminal of second amplifier 304 is coupled to a non-inverting input terminal of first amplifier 302. Second amplifier 304 can also comprise various configurations, and can operate at various bandwidths, e.g., at approximately 2 MHz, more or less. In accordance with an exemplary embodiment, second amplifier 304 comprises an auto-zero amplifier configured in an integrator circuit; however, second amplifier 304 can comprise a chopper, a high-accuracy DC amplifier, or any other amplifier that can provide correction of DC characteristics.

To facilitate the reduced settling time, composite amplifier circuit 300 comprises a compensation circuit 306 configured to provide a faster compensation path between an input terminal and an output terminal of first amplifier 302 to provide for any current required through resistor $R_0$ due to any small signals that can appear at inverting input terminal INN. Circuit 306 can comprise various types of circuit devices and components configured to provide an additional path between an input terminal and an output terminal of first amplifier 302. Compensation circuit 306 is coupled to the output terminal of first amplifier 302 and an inverting input terminal of second amplifier 304. In the exemplary embodiment illustrated in FIG. 3, compensation capacitor $C_M$ is connected directly to the inverting input terminal of second amplifier 304; however, compensation capacitor $C_M$ can also be coupled to the inverting input terminal of second amplifier 304 through one or more passive components, e.g., resistors and the like.

Figure 4:
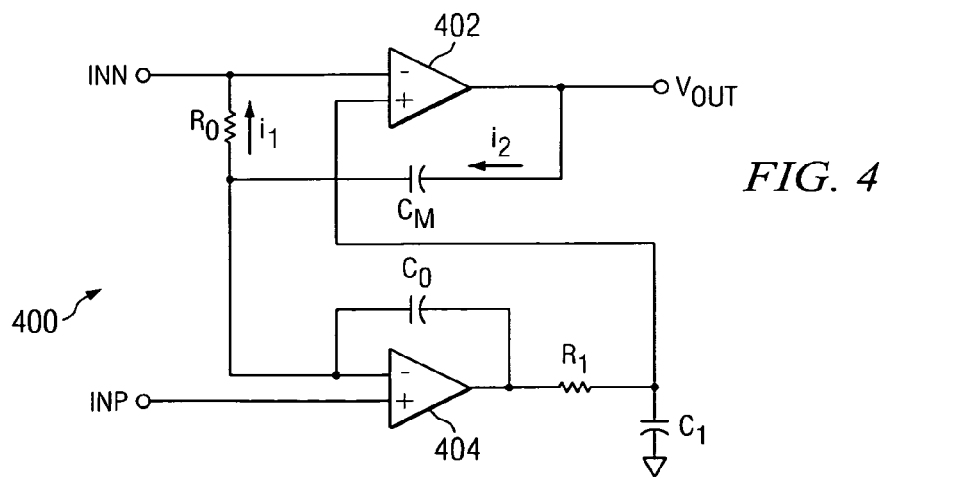
FIG. 4 illustrates a schematic diagram of an exemplary composite amplifier circuit having an additional compensation path in accordance with an exemplary embodiment of the present invention.

For example with reference again to FIG. 4, in accordance with an exemplary embodiment, a composite amplifier circuit 400 comprises a first amplifier 402, e.g., a high-speed amplifier, configured with a second amplifier configured as a lower speed auto-zero amplifier 404. High-speed amplifier 402 is configured for providing an output voltage at output terminal $V_{OUT}$, and can be configured in various arrangements. The inverting input terminal of high-speed amplifier 402 is also configured to provide a negative input terminal INN for composite amplifier circuit 400.

Auto-zero amplifier 404 comprises an integrator circuit including a resistor $R_0$ and a capacitor $C_0$. With low frequency signals provided through the integrator circuit comprising auto-zero amplifier 404, resistor $R_0$ and capacitor $C_0$, very low DC offset and low 1/f noise can be realized. A non-inverting input terminal of auto-zero amplifier 404 is configured to provide a positive input terminal INP for composite amplifier circuit 400. An output terminal of auto-zero amplifier 404 is coupled to a non-inverting input terminal of high-speed amplifier 402 through a first order low-pass filter comprising resistor $R_1$ and capacitor $C_1$ configured at the output terminal of auto-zero amplifier 404. The low-pass filter is configured to reduce noise from auto-zero amplifier 404, including auto-zero switching noise.

To provide a reduced settling time, a faster path is configured between the inverting input terminal of low-speed amplifier 404 and output terminal $V_{OUT}$ of composite amplifier circuit 400 for any current required by the integrator circuit of low speed amplifier 404 due to step input signals applied at input terminal INN. In accordance with an exemplary embodiment, the faster path is realized through the addition of a compensation capacitor $C_M$ coupled between output terminal $V_{OUT}$ and the inverting input terminal of low-speed amplifier 404, e.g., connected to integrator resistor $R_0$ of the integrator circuit.

Compensation capacitor $C_M$ can comprise various circuit arrangements and devices. For example, compensation capacitor $C_M$ can comprise a single capacitor device, or multiple capacitor devices coupled together in series and/or parallel. In addition, compensation capacitor $C_M$ can comprise various values depending on any given number of design criteria. In accordance with an exemplary embodiment, compensation capacitor $C_M$ has a value corresponding to and/or based upon the gain bandwidth product of high-speed amplifier 402, as well as the value of integrator resistor $R_0$ of the integrator circuit. For example:

$$\frac{1}{R_0 C_M} = 2\pi GBW, \text{ thus}$$

$$CM = \frac{1}{R_0 2\pi GBW}$$

Thus, where the unity gain bandwidth for high-speed amplifier 402 is 100 MHz and integrator resistor $R_0$ includes a 1 Megaohm resistance, compensation capacitor $C_M$ comprises approximately 1.6 ff in capacitance. In addition, the larger the value of integrator resistor $R_0$ and/or the higher the unity gain bandwidth for high-speed amplifier 402, the smaller the capacitance of compensation capacitor $C_M$.

Figure 6:
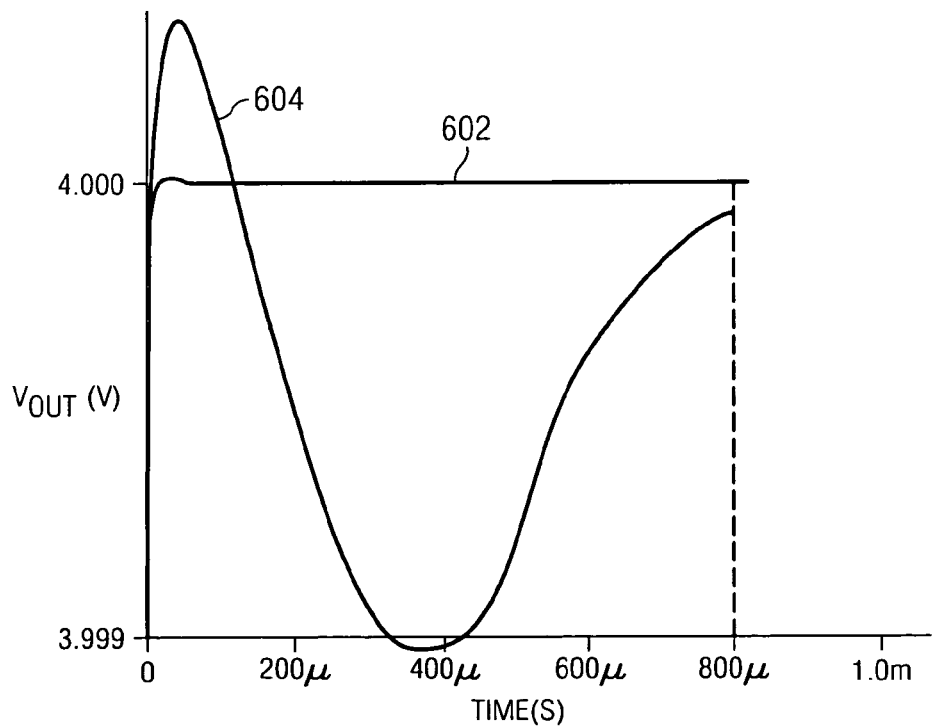
FIG. 6 illustrates a step response curve of a prior art amplifier circuit as compared to a step response curve of an exemplary composite amplifier circuit in accordance with an exemplary embodiment of the present invention.

With reference to FIG. 6, a "zoomed-in" diagram illustrates curves from a prior art composite amplifier circuit 100 and exemplary composite amplifier circuit 400 representing output signals at output terminal $V_{OUT}$ based on a step input signal configured to provide an ideal final value 4.00000 volt signal for both circuits. As realized by the "zoomed-in" view illustrated in FIG. 6, upon receiving the step input signal, the output signal of composite amplifier circuit 400 represented by curve 602 settles significantly faster than that of the output signal represented by curve 604 of circuit 100, as circuit 100 requires approximately another 1 mS before the output signal reaches within 0.001% accuracy.

The value of compensation capacitor $C_M$ to facilitate a reduced settling time can comprise a small capacitance value in many applications. Implementing smaller value capacitances can be difficult in some instances. In such instances, the effect of compensation capacitor $C_M$ to facilitate a reduced settling time can also be achieved by selecting a larger value capacitance, and by suitably dividing down integrator resistor $R_0$. Thus, for example, instead of selecting a smaller capacitor, such as a 1.6 ff value capacitance, for compensation capacitor $C_M$, a larger value capacitance, e.g., 16 ff or more, can be utilized by suitably dividing integrator resistor $R_0$ into two or more smaller resistors having a total resistance approximate that of integrator resistor $R_0$. Compensation capacitor $C_M$ can be connected between the two or more smaller resistors to enable a larger capacitance value to be utilized, e.g., compensation capacitor $C_M$ can be coupled to the inverting input terminal of low-speed amplifier 404 through integrator resistor $R_0''$.

Figure 5:
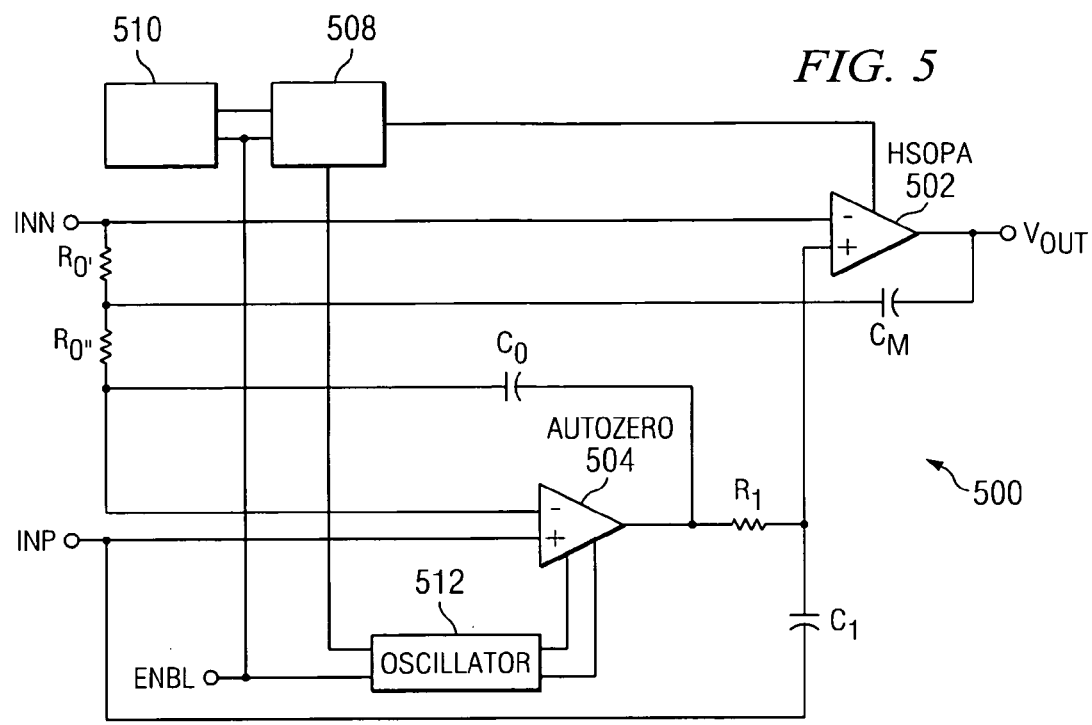
FIG. 5 illustrates a schematic diagram of an exemplary composite amplifier circuit having an additional compensation path in accordance with another exemplary embodiment of the present invention.

For example, with momentary reference to FIG. 5, for an integrator resistor $R_0$ having 1 Megaohm resistance, a 100 kilo-ohm resistor $R_0'$ and 900 kilo-ohm resistor $R_0''$, or other like resistance values for resistors $R_0'$ and $R_0''$ can be implemented. In addition, other larger values of capacitance of compensation capacitor $C_M$ can be selected through appropriate configuration of integrator resistors $R_0'$ and $R_0''$ and connection of compensation capacitance $C_M$ in between. As a result, a larger capacitance can be utilized to provide the additional path for the current required from input resistor $R_0$ from output terminal $V_{OUT}$ of high-speed amplifier 402.

In addition to reduced settling time, the additional path provided by compensation capacitor $C_M$ can also minimize the effects from process variations in the various resistors and capacitors, as well as the amplifier gains, realized in composite amplifier circuit 400. As long as the combined loop gain of the integrator circuit and the high-speed amplifier path is sufficient enough, the settling time effects of process variations of input resistor $R_0$, compensation capacitor $C_0$, and amplifier gains of amplifiers 402 and 404 can be minimized.

A composite amplifier 400 can also be configured in other manners with an additional path to have a reduced settling time, including the addition of other components and devices. For example, with reference again to FIG. 5, an exemplary composite amplifier 500 is configured with bias devices 508 and 510 for generating current for the various components, such as amplifiers 502 and 504. In addition, composite amplifier 500 can also comprise an oscillator 512 configured with an auto-zero amplifier 504. However, composite amplifier 500 can comprise fewer or additional components and is not limited to the exemplary configuration.

Having described various exemplary embodiments for an amplifier circuit for providing a reduced settling time, an exemplary method for providing a reduced settling time in an amplifier circuit can be appreciated. With reference again to FIG. 4, in accordance with an exemplary embodiment, a method for providing a reduced settling time in an amplifier circuit comprises a first step of generating an output signal from output terminal $V_{OUT}$ of high-speed amplifier 402 configured with low-speed amplifier 404 comprising an integrator circuit. An exemplary method for providing a reduced settling time further comprises a second step of providing a faster compensation path between output terminal $V_{OUT}$ of high-speed amplifier 402 and the inverting input terminal of low-speed amplifier 404 to provide any current required through integrator resistor $R_0$ due to any small signal that can appear at the inverting input terminal of composite amplifier 400. In accordance with an exemplary embodiment, the step of providing a compensation path can comprise providing compensation capacitor $C_M$ between output terminal $V_{OUT}$ of high-speed amplifier 402, e.g., between integrator resistor $R_0$ coupled to inverting input terminal of said low-speed amplifier 404. Calculating the value of capacitance for compensation capacitor $C_M$ can be provided by the gain bandwidth product of high-speed amplifier 402 and integrator resistor $R_0$.

The present invention has been described above with reference to various exemplary embodiments. However, various other changes and modifications may be made to the exemplary embodiments without departing from the scope of the present invention. In addition, any type of transistor devices configured for performing the intended functions can be utilized to provide the various devices, whether bipolar, MOSFET or other transistor types. These and other changes or modifications are intended to be included within the scope of the present invention, as set forth in the following claims.

The invention claimed is:

1. A composite amplifier circuit configured for use within high-speed applications, said composite amplifier circuit comprising:

a first amplifier having an inverting input terminal configured as an inverting input terminal for said composite amplifier circuit, and an output terminal configured as an output terminal for said composite amplifier circuit;

a second amplifier configured as an integrator circuit, said second amplifier having a non-inverting input terminal configured as a non-inverting input terminal for said composite amplifier circuit, an inverting input terminal coupled through an integrator resistor to said inverting input terminal of said composite amplifier circuit, and an output terminal coupled to a non-inverting input terminal of said first amplifier; and a compensation circuit directly coupled between said output terminal of said composite amplifier circuit and said inverting input terminal of said second amplifier, said compensation circuit configured to provide a path for current needed by said integrator resistor due to any small signal appearing at said inverting input terminal for said composite amplifier circuit.

2. The composite amplifier circuit according to claim 1, wherein said compensation circuit comprises a compensation capacitor coupled between said output terminal of said composite amplifier circuit and said inverting input terminal of said second amplifier.

3. The composite amplifier circuit according to claim 2, wherein a value of said compensation capacitor is based upon a gain bandwidth product of the first amplifier and a value of said integrator resistor.

4. The composite amplifier circuit according to claim 3, wherein said compensation capacitor comprises a single capacitor having a capacitance value between approximately 10 fF and 16 fF.

5. The composite amplifier circuit according to claim 1, wherein said integrator circuit comprises:
said integrator resistor coupled between said inverting input terminal for said composite amplifier circuit and said inverting input terminal for said second amplifier, said integrator resistor further coupled to said compensation circuit; and
an integrator capacitor coupled between said inverting input terminal for said second amplifier and said output terminal for said second amplifier.

6. The composite amplifier circuit according to claim 5, wherein said compensation circuit comprises a compensation capacitor coupled to said output terminal of said composite amplifier circuit and said integrator resistor.

7. The composite amplifier circuit according to claim 1, wherein said first amplifier comprises a high-speed amplifier, and said second amplifier comprises a low-speed amplifier configured for correction of DC characteristics in said high-speed amplifier.

8. A composite amplifier circuit configured for use within high-speed applications, said composite amplifier circuit comprising:
a first amplifier having an inverting input terminal configured as an inverting input terminal for said composite amplifier circuit, and an output terminal configured as an output terminal for said composite amplifier circuit;
a second amplifier configured as an integrator circuit, said second amplifier having a non-inverting input terminal configured as a non-inverting input terminal for said composite amplifier circuit, an inverting input terminal coupled through an integrator resistor to said inverting input terminal of said composite amplifier circuit, and an output terminal coupled to a non-inverting input terminal of said first amplifier; and
a compensation circuit coupled between said output terminal of said composite amplifier circuit and said inverting input terminal of said second amplifier, said compensation circuit configured to provide a path for current needed by said integrator resistor due to any small signal appearing at said inverting input terminal for said composite amplifier circuit,
wherein said integrator circuit comprises:
said integrator resistor coupled between said inverting input terminal for said composite amplifier circuit and said inverting input terminal for said second amplifier, said integrator resistor further coupled to said compensation circuit; and
a integrator capacitor coupled between said inverting input terminal for said second amplifier and said output terminal for said second amplifier; and
wherein said integrator resistor comprises at least two resistors connected together, said compensation circuit coupled to said output terminal of said composite amplifier circuit and between said two resistors, such that a value of capacitance for said compensation can be increased.

9. A method for providing a reduced settling time in an amplifier circuit, said method comprising the steps of:
generating an output signal from an output terminal of a first amplifier configured with a second amplifier, said second amplifier comprising an integrator circuit; and
providing a compensation path directly between said output terminal of said first amplifier and an inverting input terminal of said second amplifier to provide any current required through an integrator resistor between an inverting input terminal of said first amplifier and said inverting input terminal of said second amplifier due to any small signal appearing at an inverting input terminal of said amplifier circuit.

10. The method according to claim 9, wherein said step of providing a compensation path comprises providing a compensation capacitor between said output terminal of said first amplifier and said inverting input terminal of said second amplifier.

11. The method according to claim 10, wherein said integrator resistor comprises at least two resistors connected together with said compensation capacitor connected in between, and wherein said step of providing a compensation capacitor comprises selecting an increased capacitance value as a result of a resistor divider network provided from said at least two resistors.

12. A method for providing a reduced settling time in an amplifier circuit, said method comprising the steps of:
generating an output signal from an output terminal of a first amplifier configured with a second amplifier, said second amplifier comprising an integrator circuit; and
providing a compensation path directly between said output terminal of said first amplifier and an inverting input terminal of said second amplifier to provide any current required through an integrator resistor between an inverting input terminal of said first amplifier and said inverting input terminal of said second amplifier due to any small signal appearing at an inverting input terminal of said amplifier circuit,
wherein said step of providing a compensation path comprises providing a compensation capacitor between said output terminal of said first amplifier and said inverting input terminal of said second amplifier, and
wherein said step of providing a compensation capacitor comprises selecting a capacitance value based on a gain bandwidth product and a value of said integrator resistor.

13. An amplifier circuit configured for use within high-speed applications, said amplifier circuit comprising:
a high-speed amplifier having an inverting input terminal and an output terminal;
a low-speed amplifier configured as an integrator, said low-speed amplifier having a non-inverting input terminal, an inverting input terminal coupled through an integrator resistor to said inverting input terminal of said high-speed amplifier, and an output terminal coupled to a non-inverting input terminal of said high-speed amplifier; and a compensation circuit directly coupled between said output terminal of said high-speed amplifier and said integrator resistor, said compensation circuit configured to provide a path for current needed by an integrator resistor due to any signal appearing at said inverting input terminal for said high-speed amplifier.

14. The amplifier circuit according to claim 13, wherein said compensation circuit comprises a compensation capacitor coupled between said output terminal of said high-speed amplifier and said inverting input terminal of said low-speed amplifier.

15. The amplifier circuit according to claim 14, wherein a value of said compensation capacitor is calculated based on a gain bandwidth product for said high-speed amplifier and a resistance value for said integrator resistor.

16. The amplifier circuit according to claim 13, wherein said low-speed amplifier comprises an auto-zero amplifier.

17. The amplifier circuit according to claim 15, wherein said compensation capacitor comprises a capacitance value between approximately 10 fF and 20 fF.

18. An amplifier circuit configured for use within high-speed applications, said amplifier circuit comprising:

a high-speed amplifier having an inverting input terminal and an output terminal;

a low-speed amplifier configured as an integrator, said low-speed amplifier having a non-inverting input terminal, an inverting input terminal coupled through an integrator resistor to said inverting input terminal of said high-speed amplifier, and an output terminal coupled to a non-inverting input terminal of said high-speed amplifier; and a compensation circuit coupled between said output terminal of said high-speed amplifier and said integrator resistor, said compensation circuit configured to provide a path for current needed by said integrator resistor due to any signal appearing at said inverting input terminal for said high-speed amplifier, wherein said compensation circuit comprises a compensation capacitor coupled between said output terminal of said high-speed amplifier and said inverting input terminal of said low-speed amplifier, and wherein said integrator resistor comprises at least two resistors connected together with said compensation capacitor coupled to said inverting input terminal of said second amplifier through at least one of said at least two resistors.

* * * * *